US011867718B2

(12) United States Patent
Hackl et al.

(10) Patent No.: US 11,867,718 B2
(45) Date of Patent: Jan. 9, 2024

(54) METHOD AND DEVICE FOR IDENTIFYING AND LOCATING CYCLIC MOMENTARY INSULATION FAULTS IN AN UNDERGROUND POWER SUPPLY SYSTEM

(71) Applicant: Bender GmbH & Co. KG, Gruenberg (DE)

(72) Inventors: Dieter Hackl, Fernwald (DE); Karl Schepp, Reiskirchen (DE); Pascal Becker, Gruenberg (DE)

(73) Assignee: Bender GmbH + Co. KG, Gruenberg (DE)

( * ) Notice: Subject to any disclaimer, the term of this patent is extended or adjusted under 35 U.S.C. 154(b) by 0 days.

(21) Appl. No.: 17/972,644

(22) Filed: Oct. 25, 2022

(65) Prior Publication Data

US 2023/0125797 A1    Apr. 27, 2023

(30) Foreign Application Priority Data

Oct. 26, 2021    (DE) ..................... 10 2021 127 848.1

(51) Int. Cl.
*G01R 31/52*    (2020.01)
*G01R 31/08*    (2020.01)
(Continued)

(52) U.S. Cl.
CPC ....... *G01R 31/083* (2013.01); *G01R 31/2839* (2013.01); *G01R 31/52* (2020.01); *G01R 31/58* (2020.01)

(58) Field of Classification Search
CPC .. G01R 31/083; G01R 31/2839; G01R 31/58; G01R 31/08
See application file for complete search history.

(56) References Cited

U.S. PATENT DOCUMENTS 6,392,422 B1 *   5/2002   Kammer ................... H02H 1/06
                                                          324/509
2004/0230385 A1 *   11/2004   Bechhoefer ............ G01R 31/11
                                                          702/57
(Continued)

FOREIGN PATENT DOCUMENTS

DE    102009037445 A1    2/2011
DE    202014009161         1/2016
(Continued)

OTHER PUBLICATIONS

Machine Translation of EP 2851692, Google Patents, May 16, 2023.
(Continued)

*Primary Examiner* — Patrick Assouad
*Assistant Examiner* — Demetrius R Pretlow
(74) *Attorney, Agent, or Firm* — Warren D. Schickli; Stites & Harbison PLLC

(57) ABSTRACT

The invention relates to a method and a device for identifying and locating cyclic momentary insulation faults in an ungrounded power supply system, the method comprising the steps: detecting a fault current caused by the momentary insulation fault as a differential current in the branch circuit to be monitored and displaying the temporal progression of the differential current via a differential current signal by means of a differential current sensor; providing a processing signal which temporally describes a process sequence of a process taking place in the consumer; correlating the differential current signal with the processing signal in a computing unit in order to yield a correlation signal as a measure for a temporal match between the differential current signal and the processing signal; signaling the momentary insulation fault via the computing unit by means of a signaling signal if the correlation signal shows the temporal match. The device according to the invention has (Continued)

a differential current sensor and a computing unit so that it can implement the method according to the invention.

15 Claims, 3 Drawing Sheets

(51) Int. Cl.
    *G01R 31/58*         (2020.01)
    *G01R 31/28*         (2006.01)

(56) References Cited

U.S. PATENT DOCUMENTS

| | | | | |
|---|---|---|---|---|
| 2008/0084215 | A1* | 4/2008 | Itten | H02H 7/1227 |
| | | | | 324/510 |
| 2014/0176151 | A1* | 6/2014 | Agamy | H02S 50/10 |
| | | | | 324/509 |
| 2015/0077130 | A1* | 3/2015 | Hackl | G01R 31/14 |
| | | | | 324/522 |
| 2016/0141860 | A1* | 5/2016 | Hackl | H02H 3/17 |
| | | | | 361/93.1 |
| 2016/0336732 | A1* | 11/2016 | Hackl | H02H 3/165 |
| 2018/0292466 | A1* | 10/2018 | Hackl | G01R 31/52 |
| 2018/0356456 | A1* | 12/2018 | Schaefer | G01R 27/18 |
| 2019/0020187 | A1* | 1/2019 | Hackl | H02H 3/17 |
| 2020/0081072 | A1* | 3/2020 | Hackl | G01R 31/42 |
| 2020/0153229 | A1* | 5/2020 | Biaujaud | H01F 27/288 |
| 2020/0166556 | A1 | 5/2020 | Casey et al. | |
| 2023/0228802 | A1* | 7/2023 | Halalchi | G01R 31/14 |
| | | | | 324/503 |

FOREIGN PATENT DOCUMENTS

| | | |
|---|---|---|
| DE | 102015208725 | 9/2016 |
| DE | 102018004437 A1 | 12/2018 |
| EP | 2669901 A1 | 12/2013 |
| EP | 2851692 A1 | 3/2015 |
| RU | 2744995 C1 | 3/2021 |

OTHER PUBLICATIONS

Machine Translation of DE 102009037445, Google Patents, May 16, 2023.
Machine Translation of RU 2744995, Google Patents, May 16, 2023.

* cited by examiner

METHOD AND DEVICE FOR IDENTIFYING AND LOCATING CYCLIC MOMENTARY INSULATION FAULTS IN AN UNDERGROUND POWER SUPPLY SYSTEM

This application claims priority to German Patent Application No. 10 2021 127 848.1 filed on Oct. 26, 2021, the entirety of the contents of which is incorporated by reference herein.

TECHNICAL FIELD

The invention relates to a method and a device for identifying and locating cyclic momentary insulation faults in an ungrounded power supply system having a consumer connected via a branch circuit, a differential current sensor being able to detect a fault current caused by the momentary insulation fault as a differential current in a branch circuit to be monitored of the power supply system and the temporal progression of this differential current being displayed via a differential current signal.

BACKGROUND

When higher requirements are to be met for operational, fire and contact safety, the network form of an ungrounded power supply system is used, which is also referred to as insulated network (French: isolé terre—IT) or IT system.

In this type of power supply system, the active parts of the network are separate from the ground potential—insulated to ground—or connected to ground via a high impedance.

The advantage of these networks is that the function of the connected electric consumer is not affected when a first insulation fault (first fault), such as a ground fault or a touch fault, occurs since a fault current circuit cannot become closed because of the ideally infinitely large impedance value between an active conductor of the network and ground.

This inherent safety of the ungrounded power supply system can thus ensure continuous supply of power to the consumer, which is fed by the ungrounded power supply system, even if a first insulation fault occurs.

The resistance of the ungrounded power supply system to ground (insulation resistance in the event of a fault also referred to as an insulation fault resistance or fault resistance) must therefore be constantly monitored since a fault loop would arise because of a possible second fault at another active conductor and the flowing fault current together with an overcurrent protective device would cause the installation to be shut down, resulting in an operational standstill.

Under the condition that the insulation state of the ungrounded power supply system is continuously monitored by an insulation monitoring device (IMD) in match with standard IEC 61557-8, operation of the ungrounded power supply system can continue without a prescribed time limit even if a first fault has occurred; however, it is recommended to remove the first fault as quickly as reasonably possible.

In order to fulfil the requirement of quickly removing the first fault, the use of an insulation fault location system (IFLS)—as described in product standard IEC 61557-9—represents the state of the art in particular in extended, widely branched ungrounded power supply systems having a plurality of branch circuits.

The insulation fault location system comprises essentially a test current generator and several test current sensors, which are mostly realized as measuring current transformers and are connected to an evaluation unit of the insulation fault location system for evaluation of the measuring signals.

If a first insulation fault has been identified in the ungrounded power supply system by the insulation monitoring device, the search for the insulation fault commences by the test current generator generating a test current and feeding it to the ungrounded power supply system at a central location between one or more active conductors and ground. A test current circuit becomes closed, in which the test current flows from the test current generator back to the test current generator via the live active conductors, the insulation fault and a ground connection.

The fault current is located via a detection of the test current, which can be detected in the ungrounded power supply system via test current sensors. For this purpose, each branch circuit to be monitored has a fixedly assigned test current sensor, meaning the path of the test current can be traced. This known assignment of the test current sensors to the branch circuits aids in locating the fault current.

A problem in the industrial use of the network form IT system which hitherto could not be solved satisfactorily consists of neither being able to reliably identify regularly recurring (cyclic) and only momentary insulation faults in installations and machines having the standardized insulation monitoring devices according to the current state of the art nor satisfactorily locating these insulation faults using standardized insulation fault location system according to the current state of the art.

Even highly responsive insulation monitoring devices in smaller IT systems having low leakage capacitances require a measuring time in the range of seconds in order to determine the insulation resistance. Even highly responsive insulation fault location systems require times in the range of minutes in order to locate faulty branch circuits.

Insulation faults which cause a cyclic, i.e., regularly recurring (depending on the process even only once an hour or rarer), and thus momentarily occurring fault current having a duration from a few milliseconds to several hundred milliseconds are typically treated as a parasitic disturbance by typical insulation monitoring devices and/or insulation fault location systems and are thus repressed. As convertor systems are typically used in particular in industrial IT systems, operational disturbances cannot be distinguished from the cyclic and momentary insulation faults in question using insulation monitoring devices and insulation fault location systems. Without the disturbance suppression corresponding to the state of the art, the monitoring and location systems would thus constantly output fault alarms and could therefore not be used in an industrial environment.

The cyclic and momentary insulation faults in question, such as they occur via a supply cable for a part of a production installation which depends on a process and is cyclically dragged across a grounded and conductive metal part, typically do not affect the production process for months owing to the inherent continued operation during a first fault in the IT system. Insulation faults of this kind thus remain unidentified for the time being.

However, recharging processes of parasitically always present network leakage capacitances in the IT system lead to a (fault) current flow during each of these cyclic and momentary insulation faults and thus to an additional electrical and thermal stress of the solid insulation in the environment of the fault location.

Over a long period of time, an increasing degradation of the electric insulation is consequently to be expected at the fault location, and the risk of the entire power supply system being shut down by overcurrent protection devices because of a second insulation fault in another part of the installation increases. This particular situation, however, is what is supposed to be prevented by the use of the network form IT system.

By using the insulation monitoring devices and insulation fault location systems known from the state of the art, it thus becomes more and more likely with the increasing degradation via the cyclic and momentary insulation fault in question that the faulty branch is detected owing to the sinking insulation resistance. The longer, however, the faulty state remains undetected, the more likely an automatic shutdown of the power supply becomes for the entire installation as a result of a second fault in another part of the installation. This needs to be prevented.

In IT systems which are equipped with insulation monitoring devices and insulation fault location systems according to the state of the art, overcurrent protection devices set with a correspondingly sensitive characteristic can shut down the faulty branch circuit in widely branched IT systems having a considerable number of branch circuits and consequently having immense network leakage capacitances during momentary insulation faults having nearly negligible impedances. Whether this shutdown actually occurs reliably and whether it would occur sooner than an identification of insulation faults when using insulation monitoring devices and insulation fault location systems according to the state of the art depends on a large number of installation parameters and can thus be only assessed with difficulty.

The use of residual current devices (RCD, MRCD) for fault protection is also conceivable for identifying cyclic and momentary insulation faults.

The combination of sufficiently large network leakage capacitances in the IT system and low-impedance, momentary insulation faults in conjunction with a suitably chosen trigger sensitivity of the residual current device can lead to the shutting down of the faulty branch circuit. The design of this combination can only be realized with great effort, however, meaning fault shutdowns due to disturbances, such as due to converter operation, are minimized. Since the load current changes occurring in the industrial field have a disturbing impact on the residual current devices, use in converter environments is mostly avoided.

Quickly detecting displacement voltages between the network and ground for identifying ground fault wipers is also known. This method, however, does not enable discovering the faulty branch circuit, and the sole criterion of the displacement voltage can lead to unwanted fault alarms.

SUMMARY OF THE INVENTION

The object of the invention at hand is therefore to propose a method and a device for identifying and locating cyclic and momentary insulation faults in an ungrounded power supply system.

This object is attained by a method in conjunction with the preamble of claim 1 by providing a processing signal which temporally describes a process sequence of a process taking place in the consumer; correlating the differential current signal with the processing signal in a computing unit in order to yield a correlation signal as a measure for a temporal match between the differential current signal and the processing signal; signaling the momentary insulation fault via the computing unit by means of a signaling signal if the correlation signal shows the temporal match.

The fundamental idea of the invention at hand is based on bringing the differential current signal of sufficiently sensitive differential current sensors, which are installed in each branch circuit to be monitored of a branched ungrounded power supply system, into correlation with a processing signal describing a process sequence in order to reliably identify disturbances of cyclic and momentary insulation faults and to be able to safely distinguish these from other parasitic disturbances. The process can be any process taking place in the consumer, such as a production or manufacturing process, which is related to a certain process sequence (process cycle) and a detectable process parameter or a control signal.

For this purpose, independently of the process sequence, differential current sensors are disposed in each branch circuit to be monitored of the branched, ungrounded power supply system in order to detect the fault current which flows in the branch circuit and flows as a differential current via the branch circuit to be monitored as a result of an insulation fault. The temporal sequence of this differential current is displayed by the corresponding differential current sensor in the form of a differential current signal and forwarded to a computing unit.

Simultaneously, a processing signal is provided, which describes a specific process sequence within the process and consequently in turn temporally correlates with the process.

For further processing in a computing unit according to the invention, the differential current signal and the processing signal are thus available. In the computing unit, the differential current signal is correlated with the processing signal to test the similarity of both signals. For this purpose, a correlation signal is formed as a measure for a temporal match in order to identify whether a temporal synchronicity of both signals, e.g., via concurring pattern sequences, is present.

If the correlation signal shows a temporal match between the differential current signal and the processing signal, i.e., if both signals have a high degree of similarity, the computing unit consequently signals that a momentary insulation fault is present. As the assignment of the differential current sensor, which has generated the differential current signal considered in the correlation, to the branch circuit is known, the faulty branch circuit is thus located.

Advantageously, the method is effective mostly universally in industrial applications, without system parameters, such as the size of the network leakage capacitance, having to be closely observed.

According to the invention, fewer spurious shutdowns and fewer unexpected total installation failures are thus to be expected compared to the state of the art.

In another advantageous embodiment, the processing signal is generated by means of a sensor device by detecting a process parameter related to the process and by displaying the temporal progression of the process parameter.

The connected consumers are supplied with energy via the ungrounded power supply system. The processes taking place in the consumer are themselves related to temporal progressions of process parameters. These process parameters, such as a load current progression of a machine electrically connected as a consumer or a motion sequence of a movable part of the connected operating means, are detected by means of a sensor device and are displayed in their temporal progression via a processing signal. This processing signal is taken into consideration in the correlation computation with the differential current signal.

The sensor technology for providing the processing signal in conjunction with the correlation computations for testing the synchronicity between the differential current signal and the processing signal enables reliably distinguishing between momentary disturbance events, such as they occur in converter operation, and the cyclic insulation faults to be detected though they only occur momentarily.

Advantageously, a physical variable describing the process sequence or a variable derived therefrom is detected.

Generally, the process parameter representing the processing signal can be any physical variable measurable in their temporal progression. As a function of the type of observed process, in particular the detection of a load current (load current signal) or an electric voltage as well as measurable mechanical or geometric variables such as mass, length, angle or a pressure pattern are considered as electric variables. A motion signal can be derived as a processing signal in particular from the motion sequence of a moveable part over time. Moreover, thermodynamic variables such as temperature or optical variables such as light intensity can also be evaluated as processing parameters using suitable sensor devices for displaying the temporal progression via a processing signal.

Furthermore, a control signal operating the process sequence is correlated as a processing signal.

In addition or as an alternative to the processing signal generated by the sensor device, a control signal operating the processing sequence is used directly by a process sequence control system (not comprised by the invention) as a processing signal. In this case, the sensor device is dispensable and the control signal provided by the processing sequence control system is included in the correlation computation with the differential current signal as a processing signal. The control signal preferably contains digital information on the process sequence.

Furthermore, the temporal progression of a displacement voltage between an active conductor of the ungrounded power supply system and ground is detected as a displacement voltage signal by means of a voltage measuring device and correlated with the differential current signal in the computing unit.

If the power supply system is operated in a disturbed system environment, for example in converter operation, the displacement voltage of one or more conductors to ground can be additionally detected in order to increase interference resistance by including the displacement voltage signal in the correlation computation. The improved interference behavior in conjunction with the detection of a load current progression as a processing signal affects the following discoveries: a differential current signal, which correlates with the load current progression but not with the progression of the displacement voltage, is most likely a disturbance signal; a differential current signal, which correlates with the displacement voltage but not with the progression of the load current, is most likely based on a momentary insulation fault.

By correlating the differential current signal with a processing signal describing the process sequence of an installation part to be monitored (of a consumer to be monitored) and, if required, by additionally linking the differential current signal with the progression of a load current and the displacement voltage, it is ensured that the branch circuit impacted by the cyclic and momentary insulation fault can be reliably identified and located.

The invention is further attained by a device for identifying and locating cyclic momentary insulation faults in an ungrounded power supply system having a consumer according to the invention connected via a branch circuit, the device in conjunction with the features of the preamble being characterized by a computing unit which is configured for receiving a processing signal which temporally describes a process sequence of a process taking place in the consumer; for correlating the differential current signal with the processing signal in order to yield a correlation signal as a measure for a temporal match between the differential current signal and the processing signal; and for signaling a momentary insulation fault by means of a signaling signal if the correlation signal shows the temporal match.

The claimed structural features of the device according to the invention implement the corresponding method steps of the method according to the invention. Thus, the technical effects attained using the method and the advantages resulting therefrom pertain to the device in equal measure.

Further advantageous embodiment features are derived from the following description and drawings, which describe a preferred embodiment of the invention using examples.

BRIEF DESCRIPTION OF THE DRAWING FIGURES

DETAILED DESCRIPTION

Figure 1:
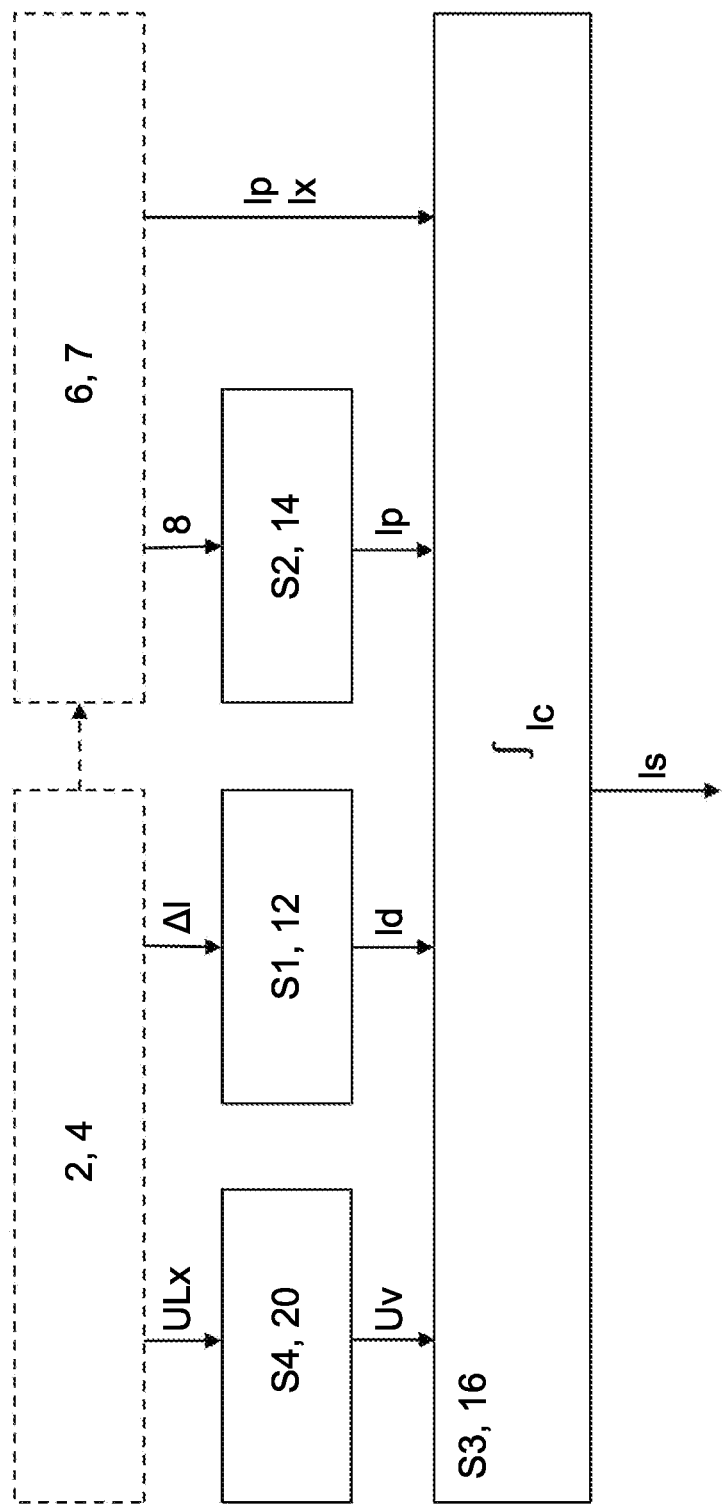
FIG. 1 shows a method sequence according to the invention.

With an ungrounded power supply system 2 having a connected consumer 6 as its base, FIG. 1 shows the interaction according to the invention between method steps S1 to S4 of the method for identifying and locating cyclic momentary insulation faults.

In step S1, a differential current ΔI is detected in a branch circuit 4 to be monitored and forwarded to a computing unit 16 as a differential current signal Id by means of a differential current sensor 12.

Simultaneously in step S2, a process parameter 8 of a process taking place in consumer 6 is detected by means of a sensor device 14 and also transmitted to computing unit 16 as a processing signal Ip in its temporal progression. As a supplementing or alternative processing signal Ip, computing unit 16 can receive a control signal Ix directly from a process sequence control system 7.

In step S3, differential current signal Id is correlated with (compared to) processing signal Ip in computing unit 16 to identify to what extent the temporal progressions show a match (similarity), i.e., have a temporal synchronicity. For this purpose, a correlation signal Ic is computed and a signaling signal Is is generated if correlation signal Ic shows a temporal match between differential current signal Id and processing signal Ip, e.g., by certain threshold values or signal patterns having distinct maxima, as a measure for the similarity of both signals.

Figure 2:
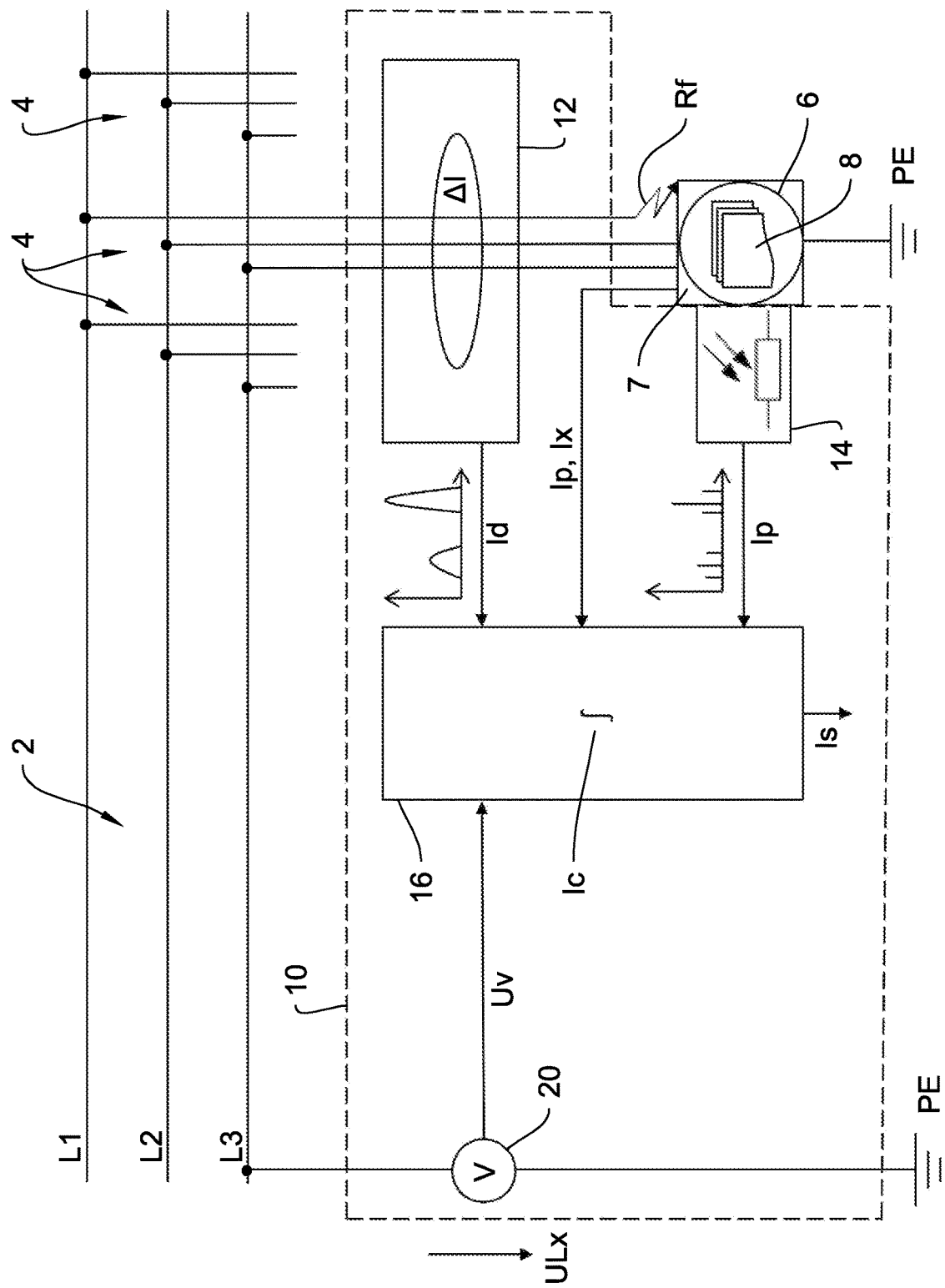
FIG. 2 shows a device according to the invention for identifying and locating cyclic momentary insulation faults in an ungrounded three-phase (3AC) power supply system.

In FIG. 2, a device 10 according to the invention for identifying and locating cyclic momentary insulation faults Rf is shown in a functional block diagram.

As the system environment for the application of the invention, a single-phase or multiphase IT system 2 is generally presumed. FIG. 2 shows a three-phase ungrounded power supply system 2 having active conductors L1, L2, L3 and branch circuits 4, which are to be monitored and to which consumer 6 is connected.

A differential current sensor 12 detects differential current ΔI in branch circuit 4 and generates differential current signal Id, which is supplied to computing unit 16.

A process sequence control system 7 (not part of the invention) controls the process taking place in consumer 6, process parameter 8 being detected simultaneously by means of sensor device 14 by monitoring differential current ΔI. Sensor device 14 generates a processing signal Ip, which corresponds to the temporal progression of detected parameter 8 and is forwarded to computing unit 16.

Sensor device 14 can be a current measuring device for measuring a load current as a process parameter 8, for example for a physical or chemical process operated by means of an electric machine, or a motion sensor for detecting a motion sequence for a mechanical process. Furthermore, optical and acoustic sensor devices 14, in particular with regard to a preventive maintenance, are also possible for measuring further physical variables.

Additionally or alternatively to processing signal Ip generated by sensor device 14, analog or digital information is supplied to computing unit 16 directly from process sequence control system 7 via processing signal Ix operating the process sequence.

In computing unit 16, differential current signal Id correlates with at least one of the supplied processing signals Ip, and a correlation signal Ic is computed as a result.

If correlation signal Ic shows a temporal match between differential current signal Id and processing signal Ip, for example in the form of synchronous artifacts or concurring periodicities, a momentary insulation fault Rf is signaled via signaling signal Is.

In the case of detecting a load current signal as processing signal Ip, a displacement voltage ULx can be additionally detected between one or several active conductors L1, L2, L3 and ground PE by means of a voltage measuring device 20 and is forwarded to computing unit 16 as displacement voltage signal Uv in order to make possible more reliably detecting a cyclic momentary insulation fault Rf by taking into consideration displacement voltage signal Uv with another correlation computation.

Figure 3:
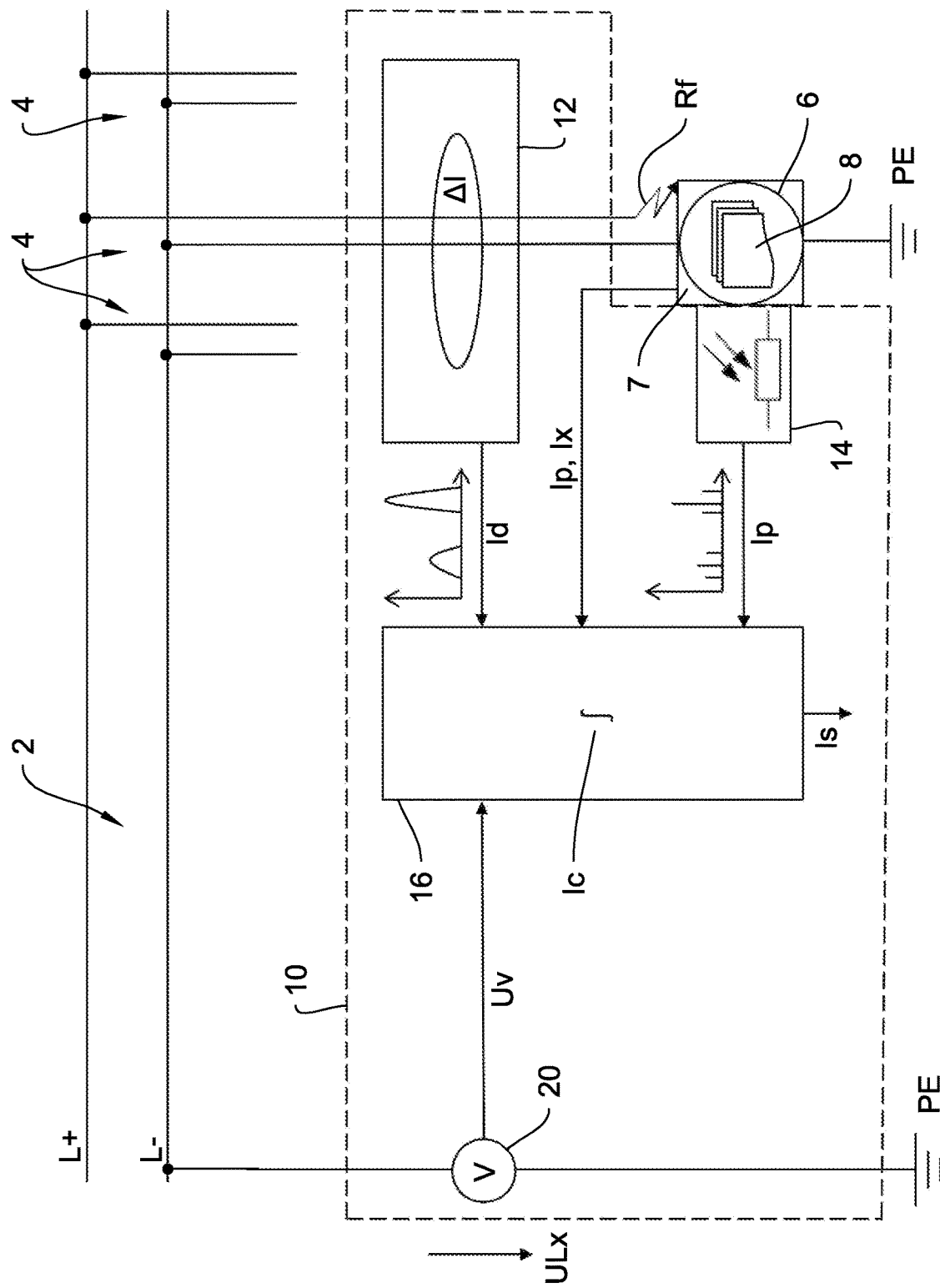
FIG. 3 shows a device according to the invention for identifying and locating cyclic momentary insulation faults in an ungrounded direct voltage (DC) power supply system.

FIG. 3 shows device 10 according to the invention for detecting and locating cyclic momentary insulation faults Rf in conjunction with an ungrounded direct voltage power supply system 2, which has active conductors L+ and L−. The circuit structure of device 10 according to the invention is implemented in the same manner as in FIG. 2. Besides being suitable for detecting a direct differential current ΔI, differential current sensor 12 is also configured for detecting a direct differential current ΔI to derive differential current signal Id.

The invention claimed is:

1. A method for identifying and locating cyclic momentary insulation faults in an ungrounded power supply system having a consumer connected via a branch circuit, the method comprising the steps:
    detecting a fault current caused by the momentary insulation fault as a differential current in the branch circuit being monitored and displaying the temporal progression of the differential current via a differential current signal by means of a differential current sensor,
    providing a processing signal which temporally describes a process sequence of a process taking place in the consumer,
    correlating the differential current signal with the processing signal in a computing unit in order to yield a correlation signal as a measure for a temporal match between the differential current signal and the processing signal, and
    signaling the momentary insulation fault via the computing unit by means of a signaling signal if the correlation signal shows the temporal match.
2. The method according to claim 1, further including generating the processing signal by means of a sensor device by detecting a process parameter related to the process and by displaying the temporal progression of the process parameter.
3. The method according to claim 2, further including detecting as a process parameter a physical variable describing the process sequence or a variable derived therefrom.
4. The method according to claim 3, further including correlating as a process signal a control signal leading the process sequence.
5. The method according to claim 4, further including detecting, by means of a voltage measuring device, between an active conductor of the underground power supply system and ground, the temporal progression of a displacement voltage as a residual voltage signal and correlating with the differential current signal in the computing unit.
6. The method according to claim 1, further including correlating as a process signal a control signal leading the process sequence.
7. The method according to claim 2, further including correlating as a process signal a control signal leading the process sequence.
8. The method according to claim 1, further including detecting, by means of a voltage measuring device, between an active conductor of the underground power supply system and ground, the temporal progression of a displacement voltage as a residual voltage signal and correlating with the differential current signal in the computing unit.
9. The method according to claim 2, further including detecting, by means of a voltage measuring device, between an active conductor of the underground power supply system and ground, the temporal progression of a displacement voltage as a residual voltage signal and correlating with the differential current signal in the computing unit.
10. The method according to claim 3, further including detecting, by means of a voltage measuring device, between an active conductor of the underground power supply system and ground, the temporal progression of a displacement voltage as a residual voltage signal and correlating with the differential current signal in the computing unit.
11. A device configured for identifying and locating cyclic momentary insulation faults in an ungrounded power supply system having a consumer connected via a branch circuit, comprising
    a differential current sensor configured for detecting a fault current caused by the momentary insulation fault as a differential current in the branch circuit being monitored and displaying the temporal progression of the differential current via a differential current signal,
    a computing unit configured for (a) receiving a processing signal which temporally describes a process sequence of a process taking place in the consumer, (b) correlating the differential current signal with the processing signal in order to yield a correlation signal as a measure for a temporal match between the differential current signal and the processing signal, and (c) signaling a momentary insulation fault by means of a signaling signal if the correlation signal shows the temporal match.

12. The device according to claim 11, further including a sensor device configured to generate the processing signal by detecting a process parameter related to the process and by displaying the temporal progression of the process parameter.

13. The device according to claim 12, wherein the sensor device is configured for detecting a physical variable describing the process sequence or a variable derived therefrom as a process parameter.

14. The device according to claim 13, wherein the processing signal is a control signal operating the process sequence.

15. The device according to claim 14, further including a voltage measuring device configured for detecting the temporal progression of a displacement voltage between an active conductor of the ungrounded power supply system and ground as a displacement voltage signal, which is correlated with the differential current signal in the computing unit.

\* \* \* \* \*

UNITED STATES PATENT AND TRADEMARK OFFICE
CERTIFICATE OF CORRECTION

PATENT NO. : 11,867,718 B2
APPLICATION NO. : 17/972644
DATED : January 9, 2024
INVENTOR(S) : Dieter Hackl et al.

It is certified that error appears in the above-identified patent and that said Letters Patent is hereby corrected as shown below:

On the Title Page

Item (54), Line 4:
Replace the word "underground" with the word "ungrounded" in the title.

In the Specification

Column 1, Line 4:
Replace the word "underground" with the word "ungrounded" in the title.

Signed and Sealed this
Thirtieth Day of July, 2024

Katherine Kelly Vidal
*Director of the United States Patent and Trademark Office*